US008125936B2

(12) United States Patent
Bar-Shalom

(10) Patent No.: US 8,125,936 B2

(45) Date of Patent: Feb. 28, 2012

(54) LOW POWER DATA STREAMING

(75) Inventor: Ofer Bar-Shalom, Kiryat Ono (IL)

(73) Assignee: Marvell International Ltd., Hamilton (BM)

(*) Notice: Subject to any disclaimer, the term of this patent is extended or adjusted under 35 U.S.C. 154(b) by 1008 days.

(21) Appl. No.: 12/044,517

(22) Filed: Mar. 7, 2008

(65) Prior Publication Data

US 2008/0219197 A1 Sep. 11, 2008

Related U.S. Application Data

(60) Provisional application No. 60/893,797, filed on Mar. 8, 2007.

(51) Int. Cl.
*G08C 17/00* (2006.01)
*G01R 31/28* (2006.01)

(52) U.S. Cl. ..................... 370/311; 714/748; 455/343.2; 340/7.33

(58) Field of Classification Search ........................ None
See application file for complete search history.

(56) References Cited

U.S. PATENT DOCUMENTS

| | | | | |
|---|---|---|---|---|
| 5,251,211 | A * | 10/1993 | Mutoh et al. | 370/445 |
| 5,692,197 | A * | 11/1997 | Narad et al. | 713/323 |
| 5,809,334 | A | 9/1998 | Galdun et al. | |
| 5,948,080 | A | 9/1999 | Baker | |
| 6,092,116 | A | 7/2000 | Earnest et al. | |
| 6,496,520 | B1 * | 12/2002 | Acosta | 370/474 |
| 6,973,071 | B1 * | 12/2005 | Bourk | 370/349 |
| 7,313,104 | B1 * | 12/2007 | Kern et al. | 370/310 |
| 2004/0059825 | A1 * | 3/2004 | Edwards et al. | 709/230 |
| 2004/0064606 | A1 | 4/2004 | Kimura | |
| 2004/0160957 | A1 * | 8/2004 | Coffman | 370/394 |
| 2005/0033874 | A1 | 2/2005 | Futral et al. | |
| 2005/0058107 | A1 * | 3/2005 | Salokannel et al. | 370/338 |
| 2006/0106949 | A1 | 5/2006 | Nicolson et al. | |

OTHER PUBLICATIONS

Notification of Transmittal of The International Search Report and The Written Opinion of the International Searching Authority, or The Declaration for International Application No. PCT/IB2007/003849; dated May 7, 2008; filed Dec. 10, 2007, 12 pgs.

International Standard, ISO/IEC 8802-11, ANSI/IEEE Std 802.11, "Information technology—Telecommunications and information exchange between systems—local and metropolitan area networks—specific requirements" Part 11: Wireless LAN Medium Access Control (MAC) and Physical Layer (PHY) specifications, *The Institute of Electrical and Electronics Engineers, Inc.*, (1999).

(Continued)

*Primary Examiner* — Steven H Nguyen

(57) ABSTRACT

To save power, a controller formats data packets for transmission to a remote device and then enters a low power mode. A direct memory access unit reads the formatted data packets and presents them to a communication interface for transmission to the remote device. A hardware logic unit matches acknowledgement and no-acknowledgement responses from the remote device for directing further packet transmission. When the hardware logic unit cannot match a response from the remote device it signals the controller to wake up for further processing.

23 Claims, 7 Drawing Sheets

OTHER PUBLICATIONS

IEEE Std 802.11g/D8.2, Apr. 2003 (Supplement to ANSI/IEEE Std 802.11, 1999 (Reaff 2003)) "Draft Supplement to Standard [for] Information technology—Telecommunications and information exchange between systems—Local and metropolitan area networks—Specific requirements, Part 11: Wireless LAN Medium Access Control (MAC) and Physical Layer (PHY) specifications: Further Higher Data Rate Extension in the 2.4 GHz Band," *The Institute of Electrical and Electronics Engineers, Inc.*, Apr. 2003.

S. A. Mujtaba, "IEEE P802.11—Wireless LANS, TGn Sync Proposal Technical Specification," doc.: IEEE 802.11-04/0889r6, May 2005.

IEEE Std 802.11a-1999 (Supplement to IEEE Std 802.11-1999) "Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: High-Speed Physical Layer in the 5 Ghz Band," *The Institute of Electrical and Electronics Engineers, Inc.*, (1999).

IEEE Std 802.11b-1999 (Supplement to ANSI/IEEE Std 802.11, 1999 Edition) "Supplement to IEEE Standard for Information technology—Telecommunications and information exchange between systems—Local and metropolitan area networks—Specific requirements Part 11: Wireless LAN Medium Access Controll (MAC) and Physical Layer (PHY) specifications: Higher-speed Physical Layer Extension in the 2.4 GHZ Band," *The Institute of Electrical and Electronics Engineers, Inc.*, 1999.

IEEE Std 802.16-2004 (Revision of IEEE Std 802.16-2001), "IEEE Standard for Local and metropolitan area networks; Part 16: Air Interface for Fixed Broadband Wireless Access Systems," *The Institute of Electrical and Electronics Engineers, Inc.*, Oct. 1, 2004; 893 pages.

IEEE Std 802.11h™-2003, "IEEE Standard for Information technology—Telecommunications and information exchange between systems—Local and metropolitan area networks—Specific requirements; Part 11: Wireless LAN Medium Access Control (MAC) and Physical Layer (PHY) specifications; Amendment 5: Spectrum and Transmit Power Management Extensions in the 5 GHz band in Europe," *The Institute of Electrical and Electronics Engineers, Inc.*, Oct. 14, 2003; 75 pages.

IEEE 802.20-PD-06; IEEE P 802.20™V14, Draft 802.20 Permanent Document; <System Requirements for IEEE 802.20 Mobile Broadband Wireless Access Systems—Version 14>, Jul. 16, 2004; 24 pages.

Specification of the Bluetooth System, Version 2.0: vol. 0, "Master Table of Contents & Compliance Requirements," pp. 1-74; vol. 1, "Architecture & Terminology Overview," pp. 1-92; vol. 2, "Core System Package [Controller Volume]", pp. 1-814; vol. 4, "Core System Package [Host Volume]," pp. 1-250, Nov. 4, 2004.

Official Action in corresponding Israeli Patent Application No. 190029 dated Sep. 25, 2011 and translation.

* cited by examiner

LOW POWER DATA STREAMING

CROSS-REFERENCE TO RELATED APPLICATION

This application claims the benefit of U.S. Provisional Application No. 60/893,797, entitled "A METHOD FOR LOW-POWER MULTIMEDIA STREAMING OVER BLUETOOTH," filed on Mar. 8, 2007. The disclosure of the above application is incorporated by reference herein in its entirety.

DESCRIPTION OF RELATED ART

Many kinds of devices send data to a remote unit or an accessory, such as a wireless headset. When sending data, a controller may format data into a packet or other appropriate format. The controller may then send the packet to a communication interface for transmission to the remote unit or accessory. If the packet is successfully received, an acknowledgement (ACK) may be sent back to the controller and another packet sent. If the packet is not successfully received, a no-acknowledgement (NACK) may be sent to the controller and the unsuccessful packet may be resent.

The devices that send data using this procedure may include media players, such as MP3 players or personal DVD players, cellular telephones, gaming systems, personal computers, automotive dashboard electronics, etc. The device may be a media player that sends data to a headset or speakers, for example. Conversely, it may receive data from a PC, remote DVD, etc. The remote unit or accessory may include docking stations, speakers, headsets, game controllers, navigation units, DVD players, hands-free accessory for cell phone or vehicle, etc.

To save power, devices that broadcast only, that is, without packet acknowledgements, may power down circuitry that would normally manage flow control and acknowledgements during the broadcast period. When transmitting with packet acknowledgements, such circuitry must remain on, with corresponding power consumption, and, in the case of battery powered units, reduction in battery life.

SUMMARY

A device and corresponding method that streams data to a receiver uses a logic unit to handle acknowledgements related to sending packets so that a main processor or controller can sleep during the transmission process. The controller may retrieve data and format a number of packets for transmission and then power down while the packets are being transferred. A memory access unit, such as a direct memory access (DMA) unit, may retrieve the formatted packets and send them sequentially to a communication interface, such as a universal asynchronous receiver/transmitter (UART). The logic unit may receive response messages corresponding to transmission of a packet and pattern match the response message with one of several expected response messages, such as an acknowledgement (ACK) or a no-acknowledgement (NACK). The logic unit may direct the memory access unit to send the next packet or resend a previous packet based on the response message.

If the response message does not correspond to one of the expected response messages, the logic unit may wake up the controller to process the response message.

In one embodiment, the controller may store controller-related state data before entering the sleep mode. The logic unit may update the state data with information related to packets sent, so that when the controller wakes up and loads the state data, it will have an indication of activity performed on its behalf while sleeping.

In another embodiment, a media device uses a DMA means and a logic means to coordinate data transmission while the media device main controller is in a low power state. The DMA means may include circuitry that takes packet address data and sequentially transfers data to the UART or other transmission circuit. The logic means may analyze response messages and signal the DMA means to send a next packet or resend a previous packet, depending on a particular response message. In one embodiment, the DMA means may be part of the UART, that is, the UART may be capable of directly reading a memory range to retrieve the appropriate data.

DETAILED DESCRIPTION

Figure 1:
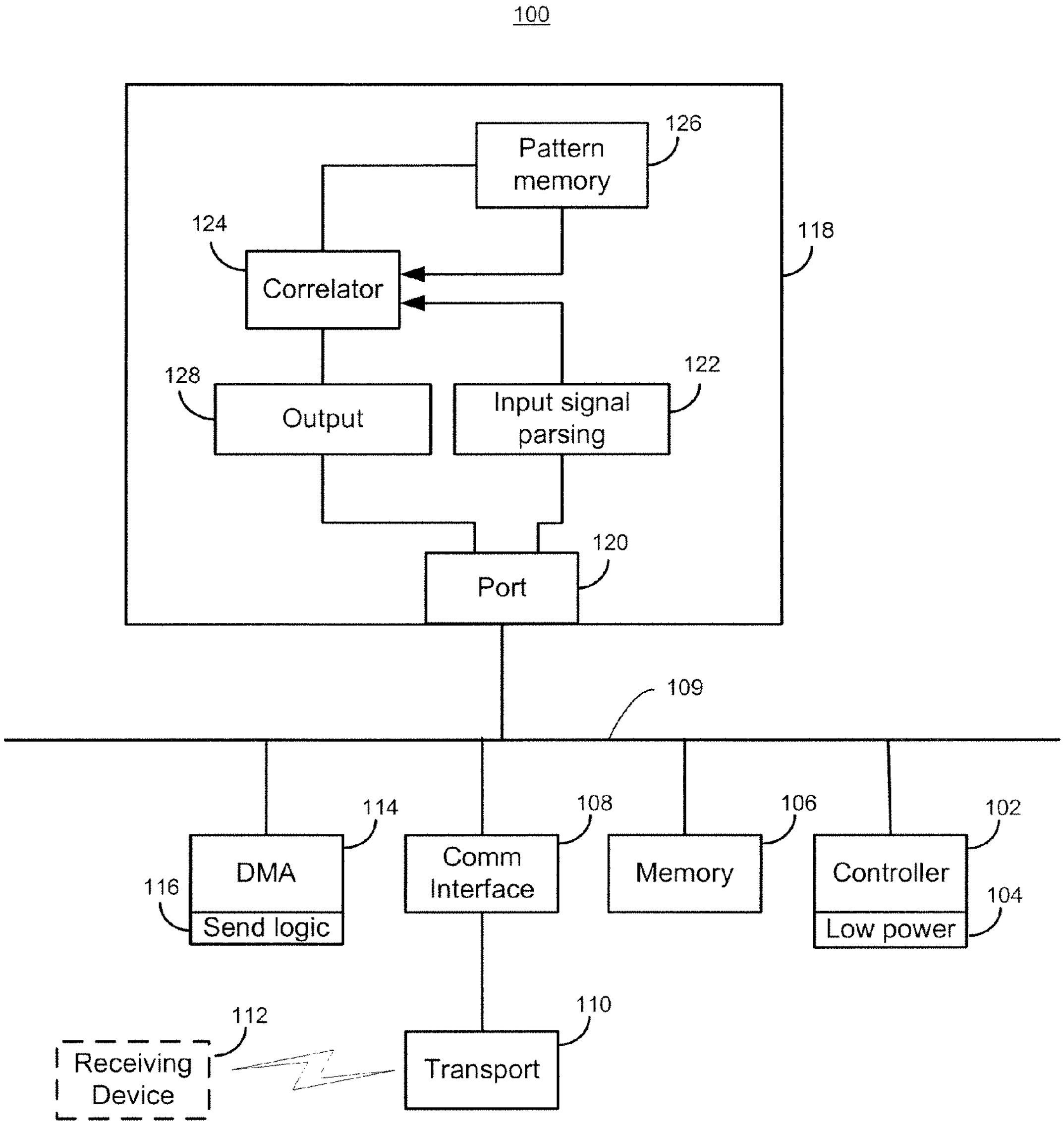
FIG. 1 is a block diagram of a device capable of low-power data streaming.

FIG. 1 is a block diagram of a device 100 capable of low-power data streaming. Specific applications of the device 100 in different examples of embodiments are shown in FIGS. 4A-4F. The device 100 may include a controller 102. The controller 102 may be a processor, such as an ARM® core processor, for example. The controller 102 may include low power circuitry 104 that allows the controller 102 to essentially turn itself off other than a function that monitors for a wakeup signal. The device 100 may also include a memory 106 that may incorporate both volatile and non-volatile memory.

A communication interface 108 may interface between a system bus 109 and a transport mechanism 110. The system bus 109 may be any of several bus architectures known and in use, for example, a peripheral control interface (PCI) or PCI express (PCIe), Industry Standard Architecture (ISA), Secure Digital Input/Output (SDIO), etc. The transport mechanism 110 may send and receive data over a wired or wireless transport with a receiving device 112, shown external to the device 100, although internal peripherals can be used. The transport mechanism 110 may support communication via Bluetooth™, 802.11 WiFi, Ethernet, ultra-wideband (UWB), etc. The receiving device 112 may be any device capable of two-way communication with the transport mechanism 110 and may include headsets, speakers, navigation units, game controllers, etc.

A direct memory access (DMA) unit 114 may provide independent access to the memory 106 and may act under the direction of the controller 102 when it is active or may act independently under previous instructions when the controller 102 is in its low-power state. The DMA unit 114 may include send logic 116 for managing incrementing through packets to be sent or retrying unsuccessful packets when the controller 102 is in the low-power state.

A logic unit 118 may manage packet delivery, or at least manage processing of response messages related to packet delivery, while the controller 102 is in the low-power state. The logic unit 118 may include a port 120 for bidirectional communication, an input signal parser 122, and a correlator 124. The correlator 124 may take input from the input signal parser 122 and for comparing response messages received via the input signal parser 122 with one or more predetermined patterns stored in a pattern memory 126. The logic unit 118 may also include an output 128 that may be activated by the correlator 124 to communicate with the DMA unit 114 or send logic 116 responsive to a matching response messages. The output 128 may also include a wakeup message for the controller 102 for use when the correlator 124 is not able to match a response message with data in the pattern memory 126.

Figure 2:
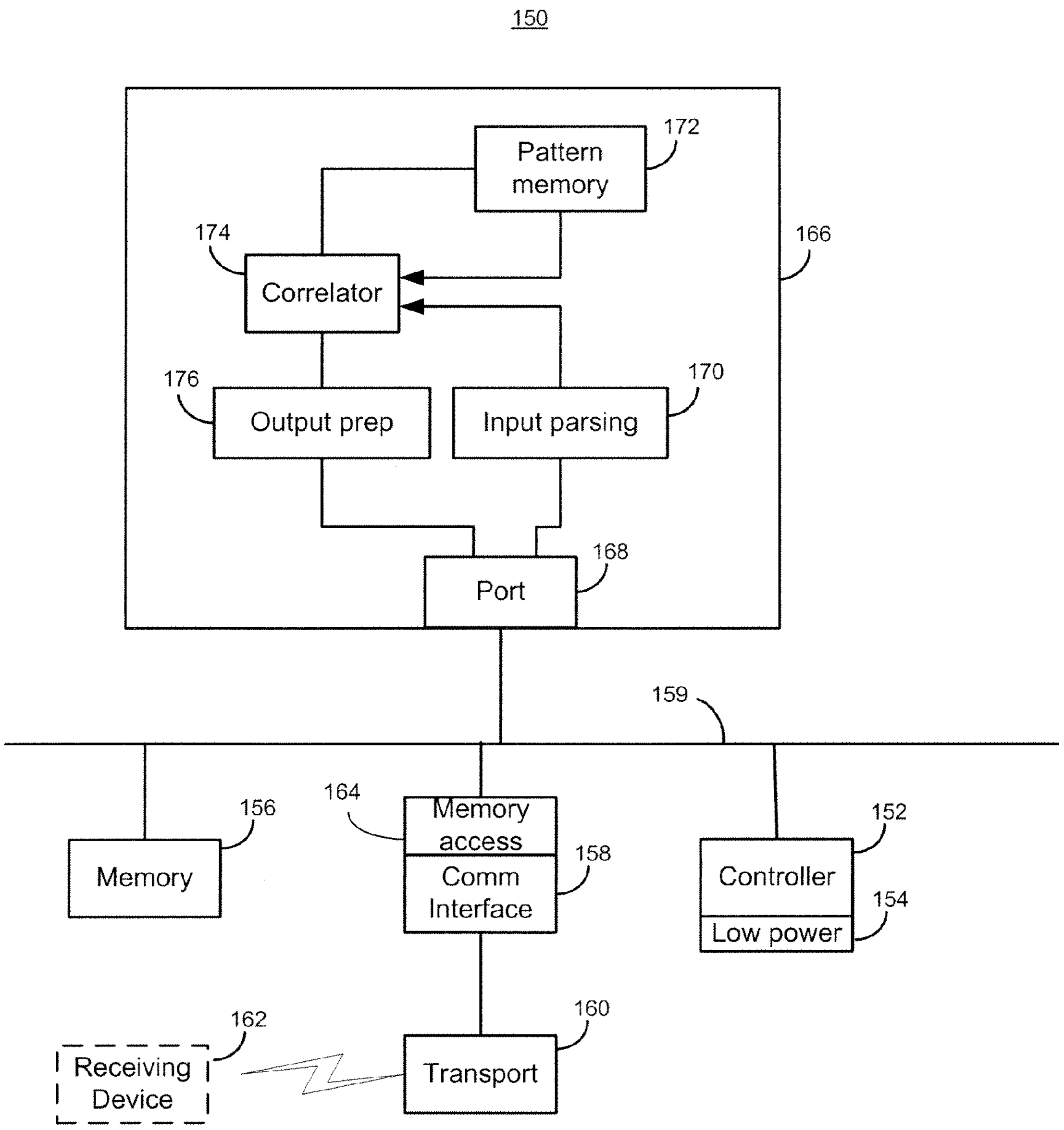
FIG. 2 is a block diagram of an alternate embodiment of a device capable of low-power data streaming.

FIG. 2 is a block diagram showing another embodiment of a device 150 adapted for low-power data streaming. The device 150 may include a controller 152. The controller 152 may be a processor, such as an ARM® core processor, for example. The controller 152 may include low power circuitry 154 that allows the controller 152 to essentially turn itself off other than a function that monitors for a wakeup signal. The device 152 may also include a memory 156 that may incorporate both volatile and non-volatile memory.

A communication interface 158 may interface between a system bus 159 and a transport mechanism 160. The system bus 159 may be any of several bus architectures known and in use, for example, a peripheral control interface (PCI) or PCI express (PCIe), industry standard architecture (ISA), SDIO, etc. The transport mechanism 160 may send and receive data over a wired or wireless transport with a receiving device 162. The transport mechanism 160 may support communication using Bluetooth™, 802.11 WiFi, Ethernet, etc. The receiving device 162 may be any device capable of two-way communication with the transport mechanism 160 and may include headsets, speakers, navigation units, game controllers, etc.

The communication interface 158 may include a memory access unit 164 that may provide independent access to the memory 156 and may act under the direction of the controller 152 when the controller 152 is active or may act independently using pre-programmed instructions when the controller 152 is in its low-power state. When the controller 152 is in a low-power state, the memory access unit 164 may be responsive to signals from a logic unit 166 (described below) to advance through a sequence of packets to be sent or to retry sending an unsuccessful packet.

The logic unit 166 may manage packet delivery, or at least manage processing of response messages related to packet delivery, while the controller 152 is in the low-power state. The logic unit 166 may include a port 168 for bidirectional communication, an input signal parser 170, and a correlator 174. The correlator 174 may take input from the input parser 170 and a pattern memory 172 for comparing response messages received via the input parser 170 with one or more predetermined patterns stored in the pattern memory 172. The logic unit 166 may also include an output 176 that may be activated by the correlator 174 to communicate with the communication interface 158 responsive to matching response messages. The output 176 may also include a wakeup message for the controller 152 for use when the correlator 174 is not able to match a response message with data in the pattern memory 172.

Figure 3:
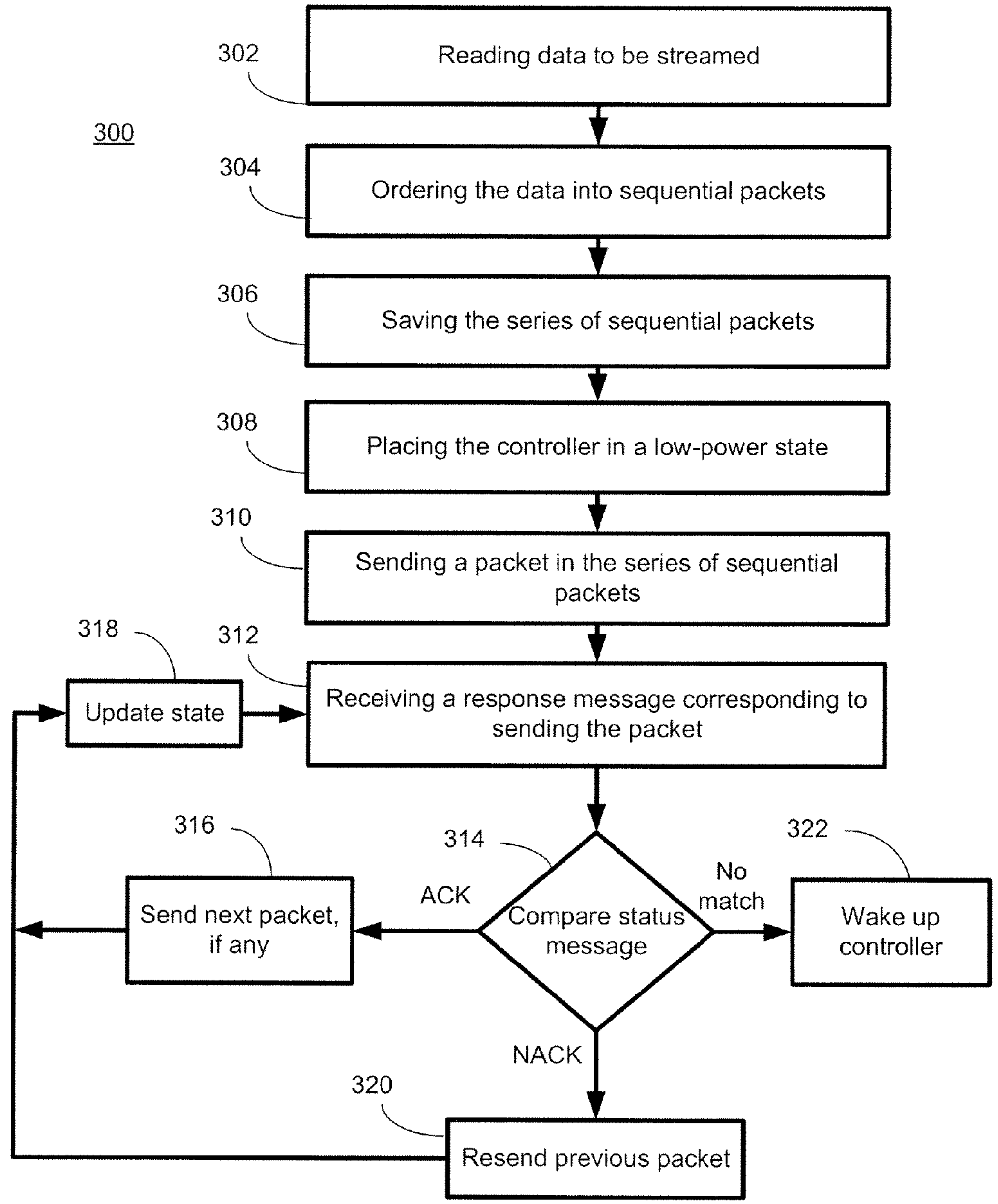
FIG. 3 is a method of using a logic unit to implement a low-power data streaming device.

FIG. 3 is a flow diagram of a method 300 for using a logic unit to implement a low-power data streaming device. The data streaming device may be similar to either the device 100 of FIG. 1 or the device 150 of FIG. 2. For the sake of clarity, the method 300 will refer to the device 100 of FIG. 1, although the method applies to other physical embodiments such as that of FIG. 2. At block 302, a controller 102 may read data to be streamed from a memory 106. The data may include multimedia data, such as audio or video, but may also include other types of data such as map data, picture data, voice over Internet protocol (VoIP), control data, text data, web page data, etc. The amount of data read may depend on the length of time the controller 102 may be reasonably powered down. For example, in a VoIP or mobile phone application that communicates with a remote microphone or headset, for example, only a few seconds worth of data may be available before the controller 102 must activate to send or receive more data. In another application, such as a music player, the only limit may be the amount of memory 106 available to store the prepared data and may allow minutes or more of operation in the low-power state.

At block 304, the controller may prepare the data by formatting the data into sequential data blocks of equal size, using padding if necessary. In another embodiment, variable length packets may be used if packet size information is made available to the DMA unit 114 so the correct amount of data can be provided to the transport 110. The controller 102 may then apply appropriate header information. For example, when the transport 110 is a Bluetooth wireless connection, the data may be wrapped in several protocol layers including an audio/video data transport protocol (AVDTP) header, a logical link control and adaptation (L2CAP) header, a host control interface (HCI) header, and a host controller transport layer, such as an H:5 implementation from Cambridge Silicon Radio known as BCSP.

At block 306, each packet in the sequence may be stored in memory, such as memory 106. When the memory 106 incorporates more than one type of memory, such as volatile and non-volatile memory, the prepared packets may be stored in a relatively fast, low-power memory, such as static random access memory, although other media may also be used.

At block 308, when the prepared data has been stored, the controller 102 may activate the send logic 116 in the DMA unit 114 as well as the logic unit 118 and enter its low-power state. The activation process may include sending packet size information, start/stop memory locations, etc. The activation process may also include sending one or more signals that indicate the controller 102 is entering the low-power state. The controller 102 may include logic to the one or more signals, and such logic may be implemented using hardware (e.g., circuitry), firmware, software or some combination of hardware, firmware, and/or software. Prior to entering the low-power state, the controller 102 may store state data related to its own state, such as program counter information, register data, etc. Some of the register data may include information regarding the latest packet to be sent and acknowledged. This register information, and optionally others, may be accessed separately, as discussed below. The controller 102 may include logic for storing the state data, and such logic may be implemented using hardware (e.g., circuitry), firmware, software or some combination of hardware, firmware, and/or software.

When the controller 102 enters the low-power state, it may suspend all activity other than monitoring for a wakeup signal. Alternatively, or in addition to monitoring for a wake up signal, the controller 102 may start a timer that will cause the controller 102 to exit the low-power state after a pre-determined period of time. In some implementations, the controller 102 may perform other minimal activities during the low-power state.

At block 310, the DMA unit 114 may retrieve a first packet from the memory 106 and queue it to the transport 110. The transport 110 may send the packet to the receiving device 112.

At block 312, the receiving device may send a response message via the transport 110. The response message may be an acknowledge (ACK), a no-acknowledge (NACK), or another message. Because the controller 102 is in the low-power state, the received message may be picked up off the bus 109 by the logic unit 118. At the logic unit 118, the port 120 may send the response message to the input signal parser 122. The input signal parser 122 may remove any protocol headers and forward the message to a correlator 124. The correlator 124 may compare the response message to predetermined patterns corresponding to expected response messages, such as ACK and NACK, SDIO command or response tokens and the like.

Alternatively, the input signal parser 122 may simply pass the received message through to the correlator 124 where the predetermined patterns may include fixed header data. Part of the activity of the correlator 124 may be to align the received message with the predetermined pattern.

At block 314, the correlator 124 may match the response message to a predetermined pattern. If the response message matches the predetermined pattern corresponding to an ACK response message, the "ACK" branch from block 314 may be taken to block 316.

At block 316, the logic unit 118 may send a signal to the DMA unit 114 to send a next packet, if any unsent packets remain. At block 318, the logic unit 118 may also update controller state data, such as register information. By directly updating the state data, the controller 102 may have immediate access to packet delivery information upon exiting the low-power state. The logic unit 118 may include logic for updating the state data, and such logic may be implemented using hardware (e.g., circuitry), firmware, software or some combination of hardware, firmware, and/or software. Execution may continue at block 312, where the device 100 may wait for a response message from the receiving device 112.

If, at block 314, the correlator matches the response message to a predetermined pattern corresponding to a NACK, the "NACK" branch from block 314 may be taken to block 320. At block 320, the logic unit 118 may send a signal to the DMA unit 114 to resend the previous packet. Execution may continue at block 318 as described above.

If, at block 314, the correlator 124 cannot match the response signal to any predetermined pattern, the "No match" branch from block 314 may be taken to block 322. At block 322, the logic unit 118 may send a signal to the controller 102 to wake up. After exiting the low-power state, the controller 102 may analyze the response signal and take appropriate action.

The logic unit 118 provides a simple and low power logic means for analyzing and responding to the most likely outcomes of sending a packet to the receiving device 112. The DMA unit 114 similarly provides a simple memory access means that reads packets from memory 106 sends packets sequentially via the communication interface 108.

By implementing the logic unit 118 and DMA unit 114 to handle the mechanics of sending packets, the device 100 may achieve lower power operation than if the controller 102 handles all send and confirmation operations. While lower power operation may be of particular interest to battery operated devices, such as portable devices, low power consumption is increasingly valued even in applications where power is plentiful, such as in a home or automotive setting.

FIGS. 4A-4F, illustrate various devices in which a low-power state for transmitting data, such as described above, may be employed.

Figure 4A:
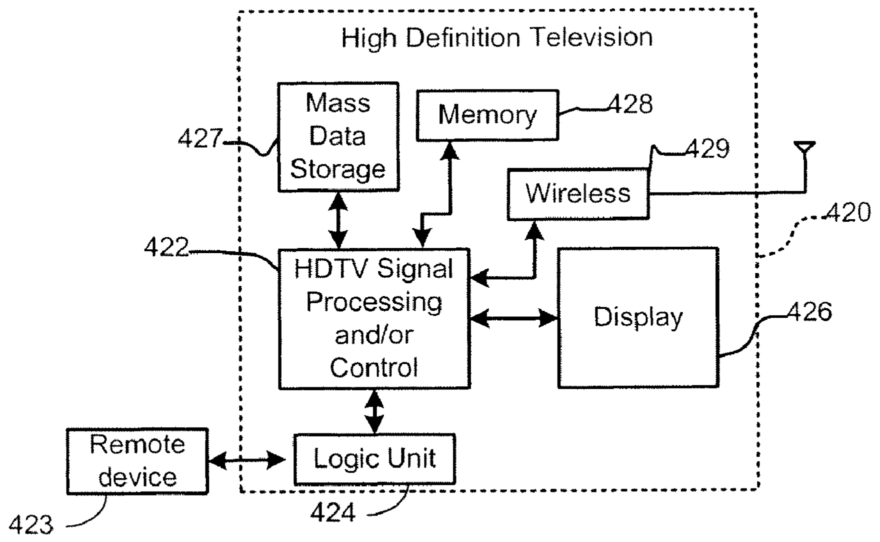
FIGS. 4A-4F illustrate various embodiments incorporating low power data streaming.

Referring now to FIG. 4A, such techniques may be utilized in a high definition television (HDTV) 420. HDTV 420 includes a mass data storage 427, an HDTV signal processing and control block 422, a wireless interface 429 and memory 428. HDTV 420 receives HDTV input signals in either a wired or wireless format and generates HDTV output signals for a display 426. In some implementations, signal processing circuit and/or control circuit 422 and/or other circuits (not shown) of HDTV 420 may process data, perform coding and/or encryption, perform calculations, format data and/or perform any other type of HDTV processing that may be required. In one embodiment, a logic unit 424 may manage data communication with a remote unit 423 over a suitable wired or wireless connection, such as Bluetooth or 802.11. The logic unit 424, remote device 423, or both, may use the devices and techniques described above for low power data streaming. The remote unit 423 may be a cordless headset or remote viewer that accepts data streamed from the logic unit 424. Alternatively, the remote unit 423 may be a media player, such as a personal portable player or a personal computer that streams data to the logic unit 424.

HDTV 420 may communicate with a mass data storage 427 that stores data in a nonvolatile manner such as optical and/or magnetic storage devices. HDTV 420 may be connected to memory 428 such as RAM, ROM, low latency nonvolatile memory such as flash memory and/or other suitable electronic data storage. HDTV 420 also may support connections with a suitable wireless connection via a wireless network interface 429. The wireless network interface 429, the HDTV signal processing and control block 422, may all also implement a low-power state for transmitting data via the wireless network 429 or to the display 426, respectively.

Figure 4B:
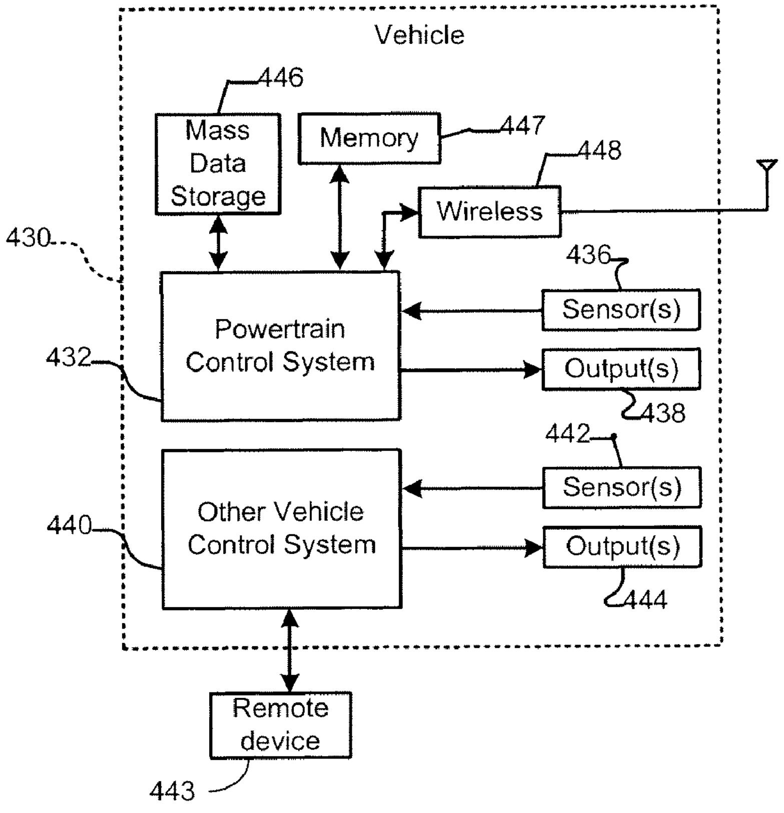

Referring now to FIG. 4B, such techniques may be utilized in a vehicle 430. The vehicle 430 includes a control system that may a powertrain control system 432, as well as a wireless interface 448. The powertrain control system 432 may receive inputs from one or more sensors 436 such as temperature sensors, pressure sensors, rotational sensors, airflow sensors and/or any other suitable sensors and/or generate one or more output control signals 438 such as engine operating parameters, transmission operating parameters, and/or other control signals.

Control system 440 may likewise receive signals from input sensors 442 and/or output control signals to one or more output devices 444. In some implementations, control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like.

The powertrain control system 432 may be connected to memory 447 such as RAM, ROM, low latency nonvolatile memory such as flash memory and/or other suitable electronic data storage. Powertrain control system 432 also may support connections with a external devices via a wireless network interface 448. In one exemplary embodiment, the control system 440 may include a logic unit for data communication with a remote device 443. For example, the remote device 443 may be an entertainment unit supported by the control system 440. In another embodiment, the remote device 443 may be a source of data, such as a personal media player. In yet another embodiment, the remote device 443 may be a removable diagnostic unit. The techniques described above for low power data streaming may be used to lower power consumption during transmission of data both to the remote device 443 and via the wireless network interface 448.

Figure 4C:
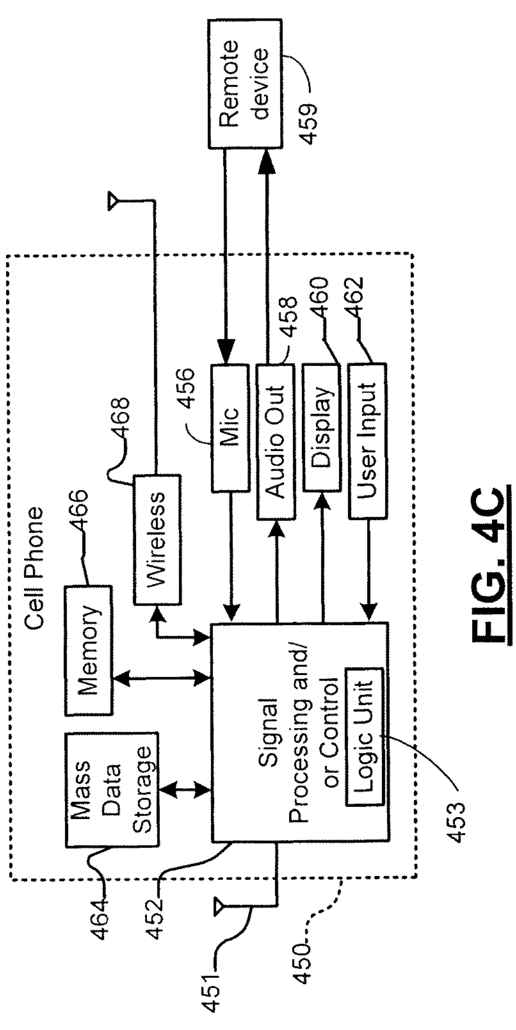

Referring now to FIG. 4C, such techniques may be used in a mobile phone 450. The mobile phone 450 may include a cellular antenna 451 and either or both signal processing and/or control circuits, which are generally identified in FIG. 4C at 452. A logic unit 453 may be used to support low power data streaming. The mobile phone 450 may also include a wireless network interface 468. In some implementations, mobile phone 450 includes a microphone 456, an audio output 458 such as a speaker and/or audio output jack, a display 460 and/or an input device 462 such as a keypad, pointing device, voice actuation and/or other input device. A remote device 459, for example, a hands-free unit, may send and receive data to the signal processing and/or control circuits 452. The signal processing and/or control circuits 452 may also process data, perform coding and/or encryption, perform calculations, format data and/or perform other mobile phone functions.

Mobile phone 450 may communicate with a mass data storage 464 that stores data in a nonvolatile manner such as optical and/or magnetic storage devices, for example hard disk drives HDD and/or DVDs. Mobile phone 450 may be connected to memory 466 such as RAM, ROM, low latency nonvolatile memory such as flash memory and/or other suitable electronic data storage. Mobile phone 450 also may support connections with a wireless network via a wireless network interface 468 that may use low-power data streaming techniques for communication with automotive accessories, such as in-vehicle displays, speakers, or personal accessories, such as the hands-free unit 459.

Figure 4D:
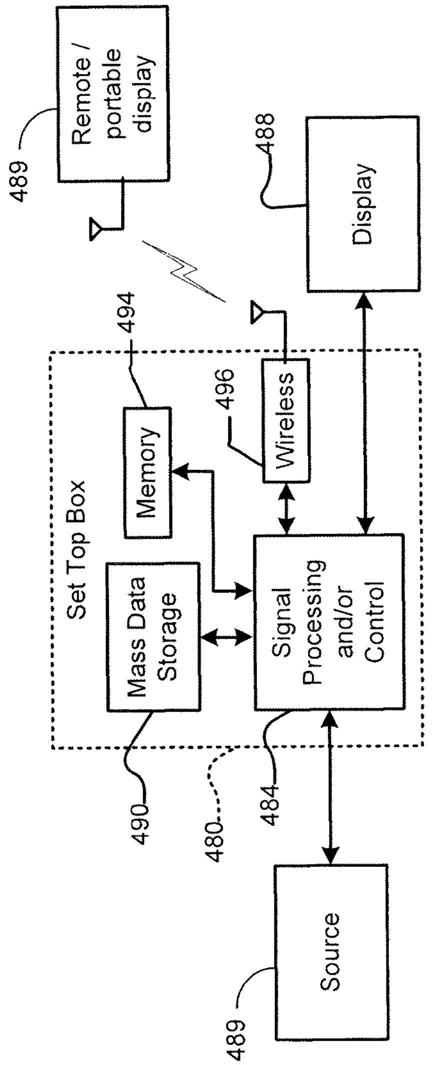

Referring now to FIG. 4D, such techniques may be utilized in a set top box 480. The set top box 480 may include a signal processing and/or control circuit which is generally identified in FIG. 4D at 484. Set top box 480 receives signals from a source 489, such as a broadband source or entertainment system, and outputs standard and/or high definition audio/video signals suitable for a display 488 such as a television and/or monitor and/or other video and/or audio output devices. Signal processing and/or control circuit 484 and/or other circuits (not shown) of the set top box 480 may process data, perform coding and/or encryption, perform calculations, format data and/or perform any other set top box function, including support for low power data streaming.

Set top box 480 may communicate with mass data storage 490 that stores data in a nonvolatile manner. Mass data storage 490 may include optical and/or magnetic storage devices for example hard disk drives HDD and/or DVDs. Set top box 480 may be connected to memory 494 such as RAM, ROM, low latency nonvolatile memory such as flash memory and/or other suitable electronic data storage. Set top box 480 also may support connections with a wireless network via a suitable wireless network interface 496. The use of low-power data streaming may also be used by the wireless network for transmission of data to a remote device 489, such as a portable media player or remote display.

Figure 4E:
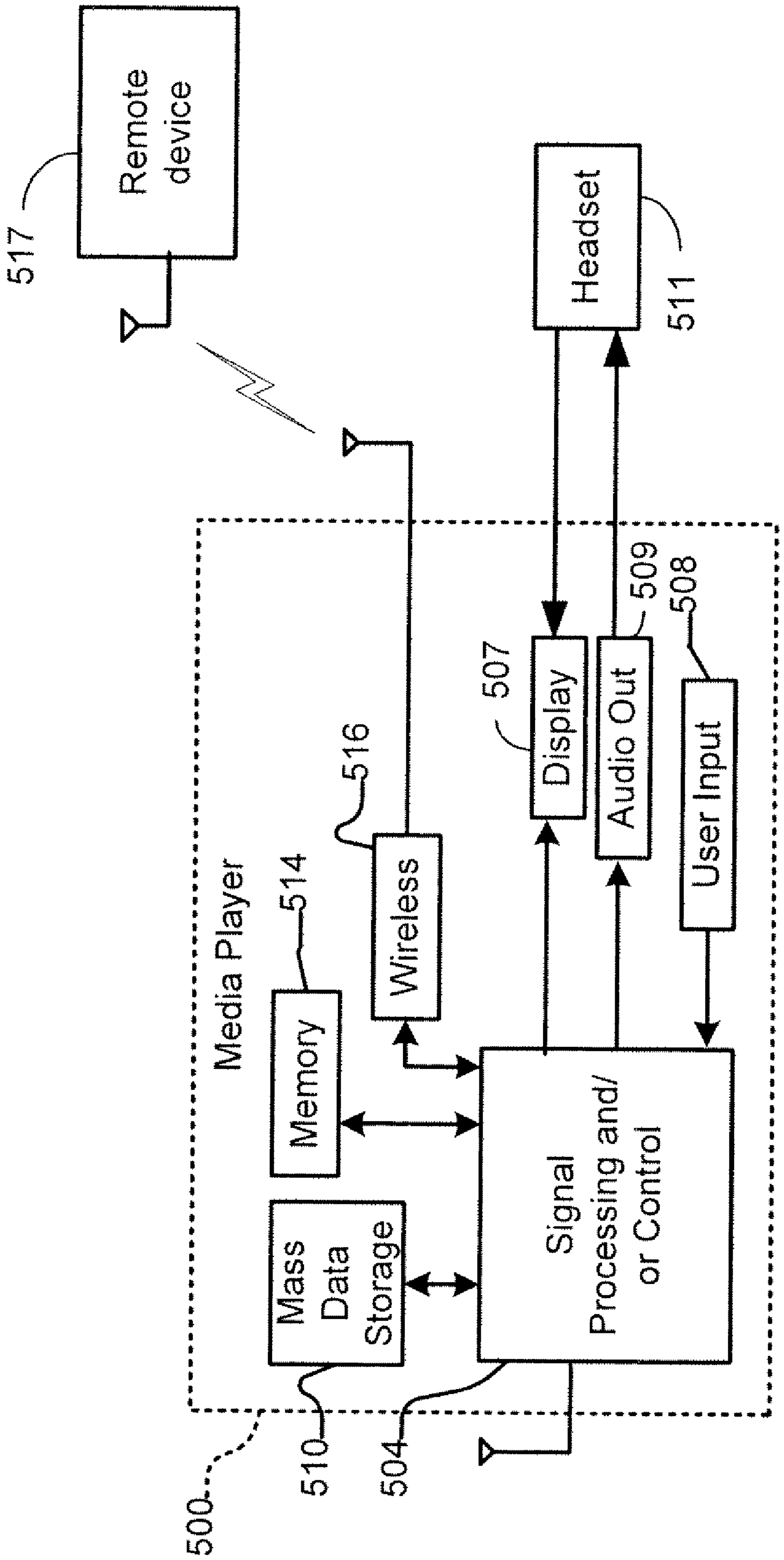

Referring now to FIG. 4E, such techniques may be used in a media player 500. The media player 500 may include either or both signal processing and/or control circuits, which are generally identified in FIG. 4E at 504, a wireless interface 516 and/or mass data storage 510 of the media player 500. In some implementations, media player 500 includes a display 507 and/or a user input 508 such as a keypad, touchpad and the like, that may be connected via a remote interface, such as Bluetooth. In some implementations, media player 500 may employ a graphical user interface (GUI) that typically employs menus, drop down menus, icons and/or a point-and-click interface via display 507 and/or user input 508. Media player 500 further includes an audio output 509 such as a speaker and/or audio output jack or wireless connections to a headset 511, via Bluetooth, for example, or another appropriate wireless protocol. The headset 511 may receive data from the signal processing and/or control circuits 504. Signal processing and/or control circuits 504 and/or other circuits (not shown) of media player 500 may process data, perform coding and/or encryption, perform calculations, format data and/or perform any other media player function, such as implement a logic unit for low power data streaming. Use of low-power data streaming techniques as described above are also applicable to other audio output to accessories or for video output to an embedded display 507.

Media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. Media player 500 may be connected to memory 514 such as RAM, ROM, low latency nonvolatile memory such as flash memory and/or other suitable electronic data storage. Media player 500 also may support connections with a wireless network via a wireless network interface 516. The use of low-power data streaming techniques may also be applied to data transmitted via the wireless network interface 516, for example, from a remote device 517. The remote device 517 may be a server, personal computer, or DVD player used to download media objects to the media player 500. Alternatively, the remote device 517 may be another media player and low power data streaming may be used for sharing media between the media player 500 and the remote device 517.

Figure 4F:
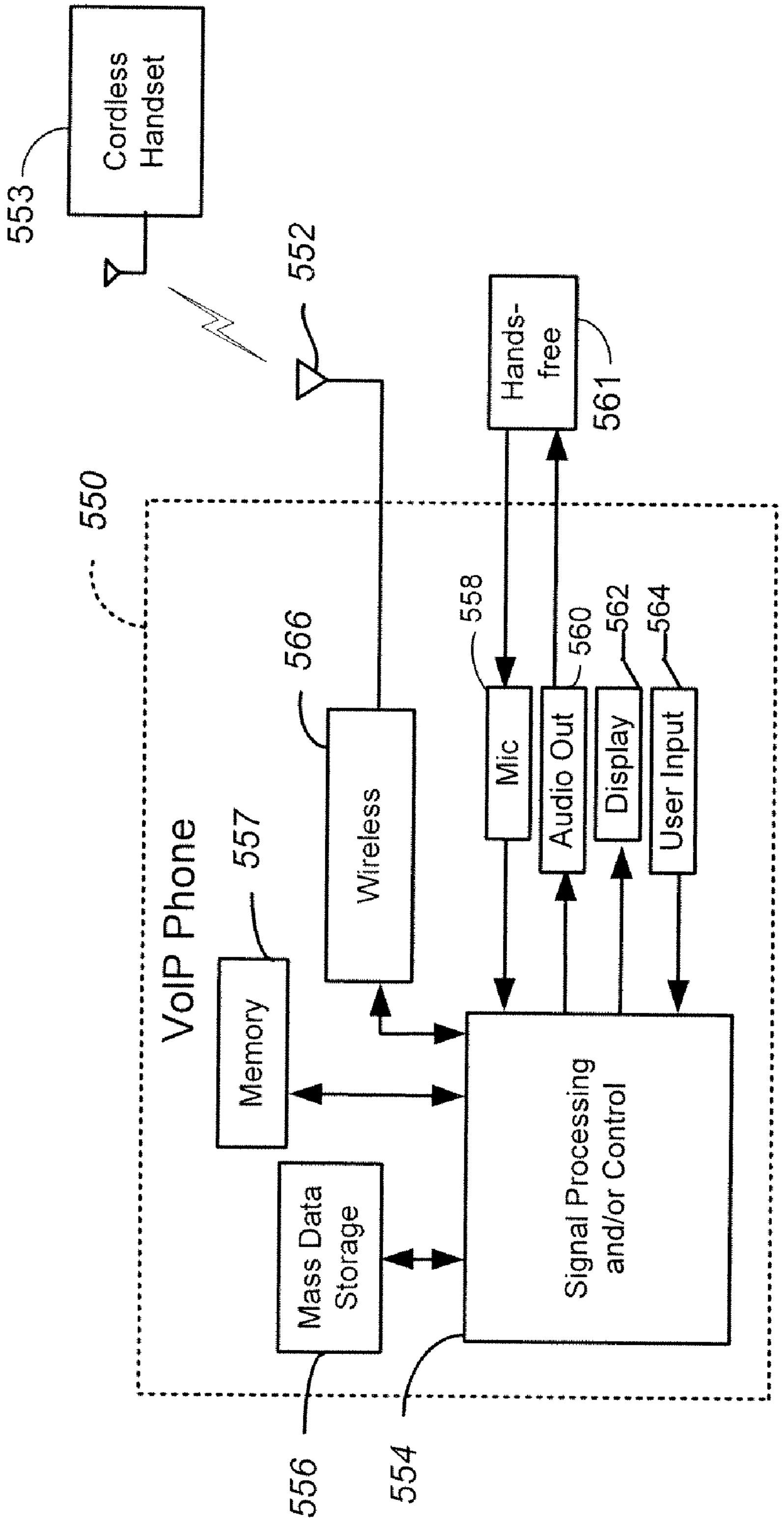

Referring to FIG. 4F, such techniques may be utilized in a Voice over Internet Protocol (VoIP) phone 550. The VoIP phone 550 may include an antenna and either or both signal processing and/or control circuits, which are generally identified in FIG. 4F at 554, a wireless interface 566 and/or mass data storage of the VoIP phone 550. In some implementations, VoIP phone 550 includes, in part, a microphone 558, an audio output 560 such as a speaker and/or audio output jack, a display monitor 562, an input device 564 such as a keypad, pointing device, voice actuation and/or other input devices. Any of the input or output elements could be remote and connected via a network, such as, Bluetooth, the wireless interface 566, or both. Signal processing and/or control circuits 554 and/or other circuits (not shown) in VoIP phone 550 may process data, perform coding and/or encryption, perform calculations, format data and/or perform other VoIP phone functions, including support for low power data streaming.

VoIP phone 550 may communicate with mass data storage 556 that stores data in a nonvolatile manner such as optical and/or magnetic storage devices, for example hard disk drives HDD and/or DVDs. VoIP phone 550 may be connected to memory 557, which may be a RAM, ROM, low latency nonvolatile memory such as flash memory and/or other suitable electronic data storage. VoIP phone 550 is configured to establish communications link with a VoIP network via a broadband Internet Protocol (IP) connection (not depicted). The wireless interface 566 may be used to support the IP connection, but may also be used to communicate with a cordless handset 553 used in a telephone call. Low-power data streaming techniques may be used when communicating data via the wireless interface 566. Low power data streaming may also be used for a connection to an accessory 561, such as a Bluetooth headset, coupled to the microphone 558 and audio output 560 connections.

The various blocks, operations, and techniques described above may be implemented in hardware, firmware, software, or any combination of hardware, firmware, and/or software. When implemented in software, the software may be stored in any computer readable memory such as on a magnetic disk, an optical disk, or other storage medium, in a RAM or ROM or flash memory of a computer, processor, hard disk drive, optical disk drive, tape drive, etc. Likewise, the software may be delivered to a user or a system via any known or desired delivery method including, for example, on a computer readable disk or other transportable computer storage mechanism or via communication media. Communication media typically embodies computer readable instructions, data structures, program modules or other data in a modulated data signal such as a carrier wave or other transport mechanism. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared and other wireless media. Thus, the software may be delivered to a user or a system via a communication channel such as a telephone line, a DSL line, a cable television line, a wireless communication channel, the Internet, etc. (which are viewed as being the same as or interchangeable with providing such software via a transportable storage medium). When implemented in hardware, the hardware may comprise one or more of discrete components, an integrated circuit, an application-specific integrated circuit (ASIC), etc.

While the present invention has been described with reference to specific examples, which are intended to be illustrative only and not to be limiting of the invention, it will be apparent to those of ordinary skill in the art that changes, additions or deletions in addition to those explicitly described above may be made to the disclosed embodiments without departing from the spirit and scope of the invention.

I claim:

1. A device comprising:

a controller to format data into packets;

a memory coupled to the controller to receive and to store the packets;

an access unit to sequentially read the packets;

a communication interface to receive the ordered set of packets from the access unit and to transmit each packet in a sequential order; and a logic unit independent of the controller to analyze response messages corresponding to each sequential packet transmission while the controller is in a low power state and to wake up the controller from the low power state when a response message fails to match a predetermined pattern.

2. The device of claim 1, wherein the controller has a power saving circuit to activate after formatting the packets and to place the controller in the low-power state.

3. The device of claim 2, wherein the controller includes logic to store state data when entering the low-power state and the logic unit includes logic to update the state data corresponding to transmission of the packets prior to the controller leaving the low-power state.

4. The device of claim 1, wherein the logic unit has a memory to store the predetermined pattern.

5. The device of claim 4, wherein the predetermined pattern includes a first pattern corresponding to an acknowledgement response message (ACK) and a second pattern corresponding to a no-acknowledgement response message (NACK).

6. The device of claim 5, wherein the logic unit has an output to signal the communication interface to resend a packet when a NACK response message is received.

7. The device of claim 1, wherein the device is a media streaming device.

8. The device of claim 1, wherein the device transmits data via a Bluetooth wireless transport.

9. The device of claim 1, wherein the device transmits data via an 802.11 wireless transport.

10. The device of claim 1, wherein the device transmits data via an Ethernet connection.

11. The device of claim 1, wherein the controller includes logic to send a low power state signal indicating the controller is entering a low power state, the low power state signal causing the access unit to begin data transmission and the low power state signal causing the logic unit to begin response message analysis.

12. The device of claim 1, wherein the logic unit comprises:

a memory to store expected response patterns;

a port coupled to the communication interface, the port to receive signals containing a response pattern corresponding to receipt of a transmitted packet by another device remote from the device; and a correlator coupled to the port and the memory of the logic unit, the correlator configured to:

compare the response pattern to the expected response patterns, send a signal via the port to send a next packet if the correlator matches the response pattern to a first response pattern, send a second signal to resend a previous packet if the correlator matches the response pattern to a second response pattern, and send a wakeup signal to the controller when the response pattern does not match any of the expected response patterns.

13. The device of claim 12, wherein the correlator is configured to update state data used by the controller when waking up from a low-power state.

14. The device of claim 12, further comprising an input circuit configured to extract the response pattern from a received signal.

15. The device of claim 12, wherein the memory to store the expected response patterns is a memory of the multimedia streaming device and the correlator is configured to retrieve the expected response patterns via the port.

16. The device of claim 1, wherein the controller is configured to read data from the memory, to format the data read from the memory into packets, and to store the packets in the memory, the controller having a low-power operating mode;

wherein the communication interface is configured to handle bi-directional communication with a receiving device remote from the device;

wherein the access unit is configured to send packets via the communication interface to the receiving device; and wherein the logic unit is configured to analyze acknowledgment information from the receiving device and to direct activities of the access unit for sending the packets.

17. The device of claim 16, wherein the access unit includes logic to respond to a signal from the logic unit to resend a previously sent packet.

18. The device of claim 16, further comprising a transport unit for receiving the packets from the communication interface and for transmitting a signal corresponding to the packets.

19. The device of claim 18, wherein the transport unit is a wireless transport.

20. The device of claim 19, wherein the wireless transport is one of 802.11 WiFi wireless transport, a Bluetooth transport, and an ultra-wideband transport.

21. A method comprising:

formatting data into packets at a controller;

storing the formatted packets in a memory;

placing the controller in the low power state after storing the formatted packets in the memory;

sequentially reading the packets from the memory;

transmitting the packets in sequential order via a communication interface;

analyzing response messages corresponding to each packet transmission at a logic unit independent of the controller;

notifying the controller when a response message fails to match a predetermined pattern; and waking the controller from the low power state when the response message fails to match the predetermined pattern.

22. The method of claim 21, further comprising:

sending another packet when the response message matches the predetermined pattern.

23. The method of claim 21, wherein analyzing the response message comprises:

comparing a status message to the predetermined pattern.

* * * * *